US009153656B2

United States Patent
Iinuma

(10) Patent No.: US 9,153,656 B2
(45) Date of Patent: Oct. 6, 2015

(54) NAND TYPE NONVOLATILE SEMICONDUCTOR MEMORY DEVICE AND METHOD FOR MANUFACTURING SAME

(71) Applicant: Kabushiki Kaisha Toshiba, Minato-ku (JP)

(72) Inventor: Toshihiko Iinuma, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/096,304

(22) Filed: Dec. 4, 2013

(65) Prior Publication Data

US 2015/0041876 A1 Feb. 12, 2015

Related U.S. Application Data

(60) Provisional application No. 61/863,492, filed on Aug. 8, 2013.

(51) Int. Cl.
*H01L 29/788* (2006.01)
*H01L 29/423* (2006.01)
*H01L 21/28* (2006.01)
*H01L 27/115* (2006.01)

(52) U.S. Cl.
CPC .... *H01L 29/42324* (2013.01); *H01L 21/28273* (2013.01); *H01L 27/11521* (2013.01); *H01L 29/7881* (2013.01)

(58) Field of Classification Search
CPC ............. H01L 2924/1438; H01L 27/11524; H01L 27/11529; H01L 27/1157; H01L 27/115; H01L 27/11521; H01L 21/28273
See application file for complete search history.

(56) References Cited

U.S. PATENT DOCUMENTS

| 6,346,467 | B1 | 2/2002 | Chang et al. |
| 2005/0045941 | A1 | 3/2005 | Kurita et al. |
| 2005/0083744 | A1* | 4/2005 | Arai et al. ..................... 365/202 |
| 2008/0116503 | A1* | 5/2008 | Tsurumi et al. ............... 257/316 |
| 2012/0146125 | A1 | 6/2012 | Kim et al. |

FOREIGN PATENT DOCUMENTS

JP 8-64702 3/1996

* cited by examiner

*Primary Examiner* — Bilkis Jahan
(74) *Attorney, Agent, or Firm* — Oblon, McClelland, Maier & Neustadt, L.L.P.

(57) ABSTRACT

According to one embodiment, a nonvolatile semiconductor memory device includes: first semiconductor regions extending in a first direction and arranged in a direction crossing the first direction; control gate electrodes provided on an upper side of the first semiconductor regions, extending in a second direction different from the first direction, and arranged in a direction crossing the second direction; a charge storage layer provided in a position each of the first semiconductor regions and each of the control gate electrodes cross; a first insulating film provided between the charge storage layer and each of the first semiconductor regions; a second insulating film provided between the charge storage layer and each of the control gate electrodes; and a silicon-containing layer in contact with part of a side wall of each of the control gate electrodes and having a gradient in a silicon concentration in a direction crossing the second direction.

9 Claims, 11 Drawing Sheets

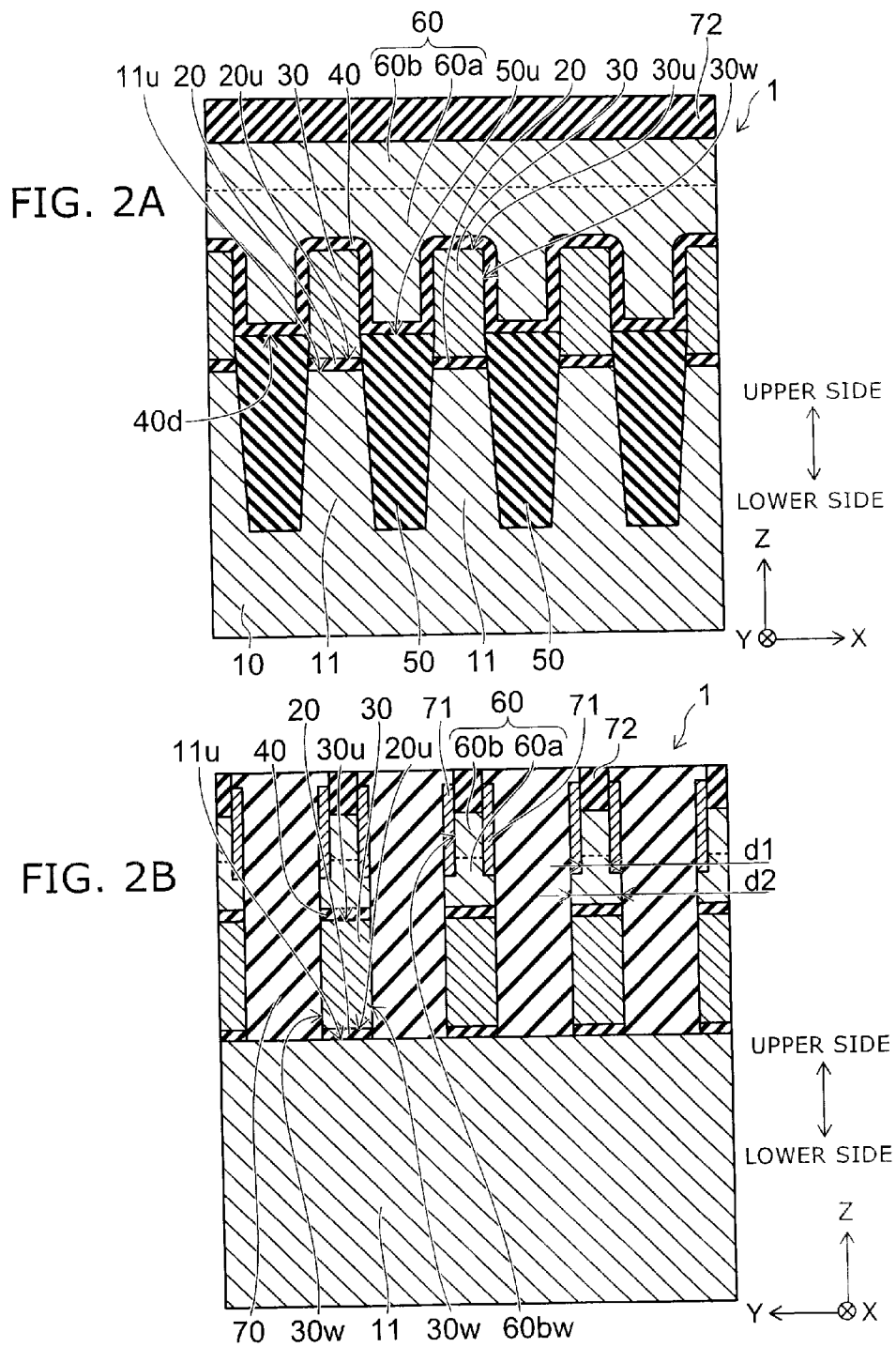

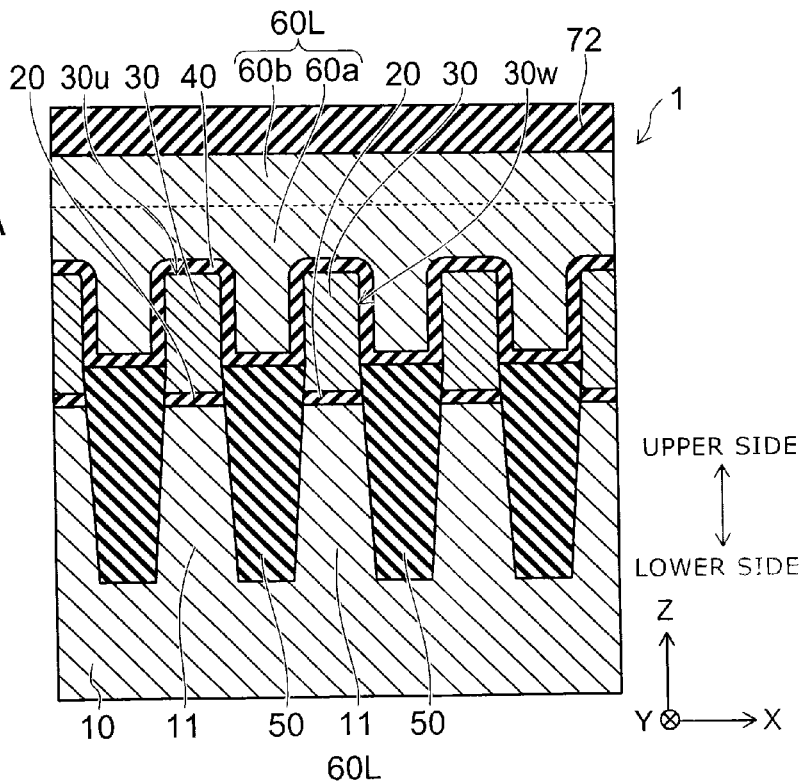
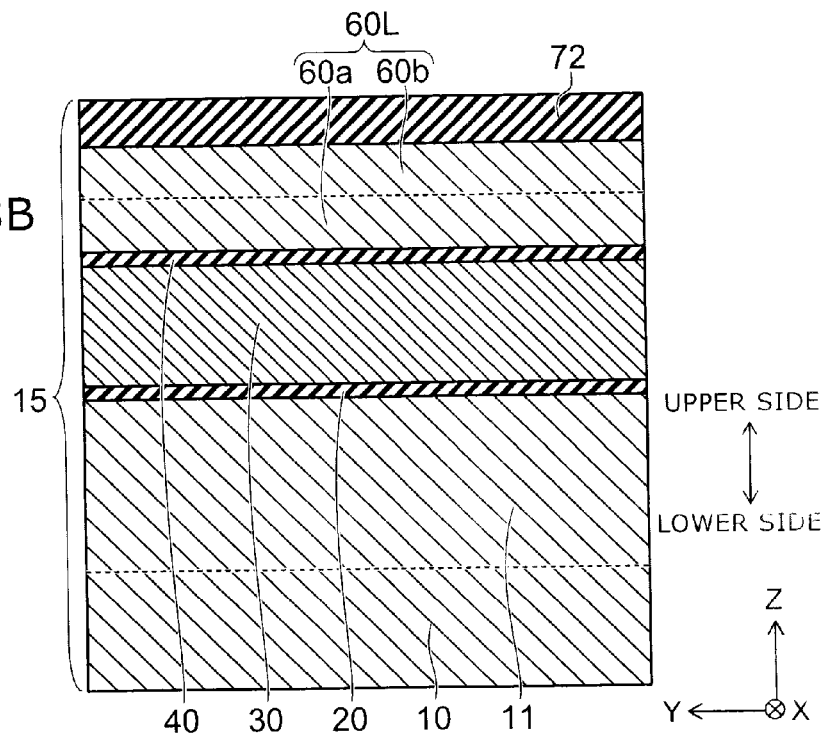

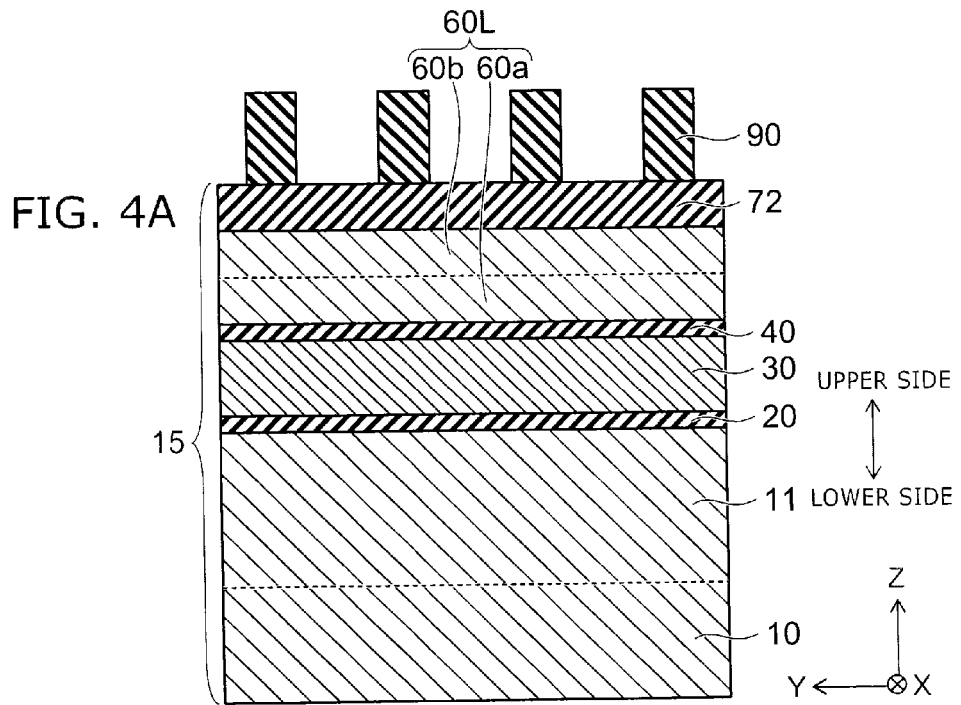
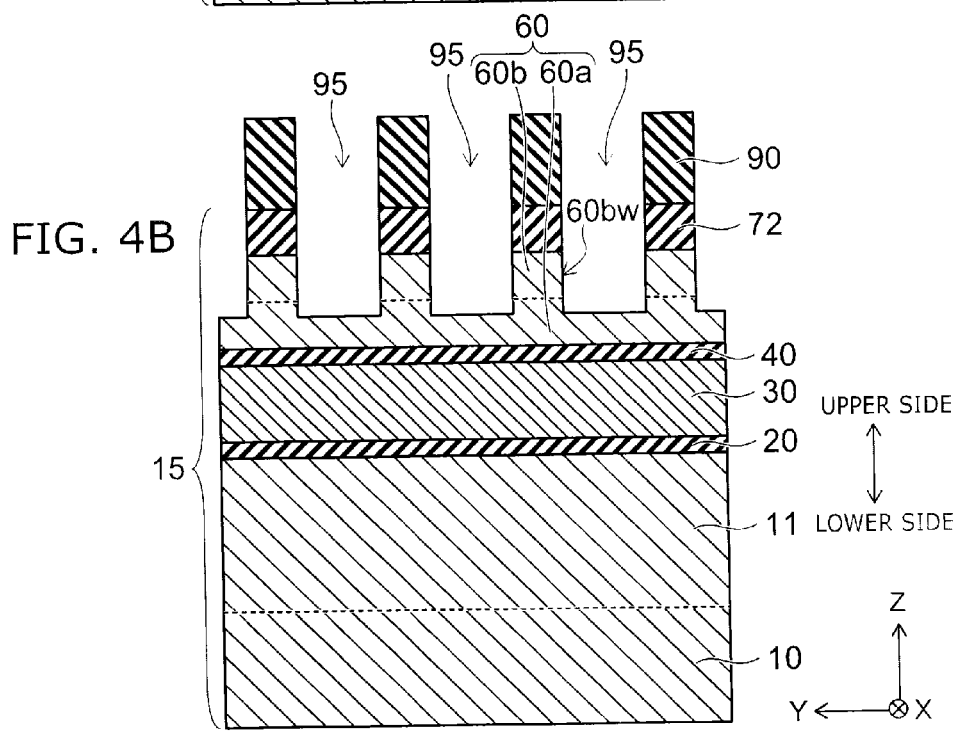

NAND TYPE NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 61/863,492, filed on Aug. 8, 2013; the entire contents of which are incorporated herein by reference.

FIELD

Embodiments described herein relate generally to a nonvolatile semiconductor memory device and a method for manufacturing same.

BACKGROUND

In the manufacturing process of a nonvolatile semiconductor memory device typified by a NAND flash memory, dry etching technology is used in order to extend control gate electrodes in a specific direction and arrange floating gate electrodes (charge storage layers) below the control gate electrodes.

However, since the control gate electrode has a structure in which a metal-containing layer is stacked for the purpose of reducing parasitic resistance, metal contamination may be brought about in the nonvolatile semiconductor memory device after the metal-containing layer is processed by dry etching. For example, when the floating gate electrode is processed by dry etching, a phenomenon will occur in which due to sputtering etc., metal is scattered from the side surface of the metal-containing layer exposed at the side surface of the control gate portion for which processing has already been completed, and the metal adheres to the side surfaces of the IPD (inter-polysilicon dielectric) layer, the floating gate electrode, etc. of the nonvolatile semiconductor memory device, the vicinity of the tunnel insulating film, etc. Furthermore, when the metal components attached to the side surfaces etc. described above are removed using wet etching processing or the like in the post-processing after the dry etching processing, a phenomenon will occur in which metal components elute from the side surface of the metal-containing layer exposed at the side surface of the control gate electrode during the wet processing, and the metal components re-adhere to the side surfaces of the IPD layer, the floating gate electrode, etc. of the nonvolatile semiconductor memory device, the vicinity of the tunnel insulating film, etc.

To avoid the possibility of such phenomena, there is a method in which the side wall of the metal-containing layer is covered with a cover layer after the control gate electrode is processed by dry etching. However, in the case where an insulating film such as a silicon oxide film and a silicon nitride film is used as the cover layer, also the cover layer may be removed by etching when the IPD layer made of an insulating film is processed, and the side surface of the metal film may not be covered when the floating gate electrode is processed. In such a case, due to the removal of the cover layer, consequently metal contaminants may be released from the metal-containing layer. In the case where a semiconductor film such as an amorphous silicon film is used as the cover layer, when the cover film is not removed but left in the processing of the floating gate electrode, there is a problem that the semiconductor cover film will remain also on the side surface of the insulating film region above the control gate electrode, and a short circuit between control gates is likely to occur.

BRIEF DESCRIPTION OF THE DRAWINGS

FIGS. 2A and 2B are schematic cross-sectional views of the nonvolatile semiconductor memory device according to the first embodiment, FIG. 2A is a schematic cross-sectional view corresponding to line A-A' of FIG. 1, and FIG. 2B is a schematic cross-sectional view corresponding to line B-B' of FIG. 1;

FIG. 3A to FIG. 7 are schematic cross-sectional views showing the manufacturing process of the nonvolatile semiconductor memory device according to the first embodiment;

DETAILED DESCRIPTION

Figure 1:
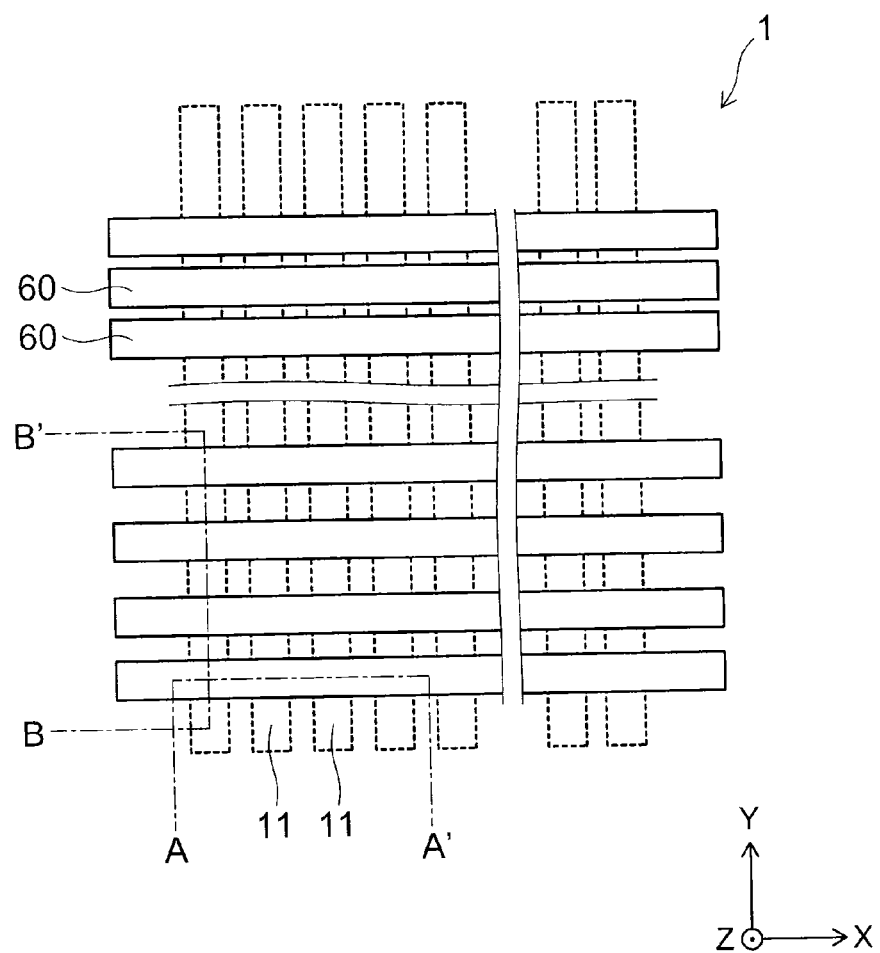
FIG. 1 is a schematic plan view of a nonvolatile semiconductor memory device according to a first embodiment.

According to one embodiment, a nonvolatile semiconductor memory device includes: a plurality of first semiconductor regions extending in a first direction, and the plurality of first semiconductor regions being arranged in a direction crossing the first direction; a plurality of control gate electrodes provided on an upper side of the plurality of first semiconductor regions, the plurality of control gate electrodes extending in a second direction different from the first direction, and the plurality of control gate electrodes being arranged in a direction crossing the second direction; a charge storage layer provided in a position, and each of the plurality of first semiconductor regions and each of the plurality of control gate electrodes cross in the position; a first insulating film provided between the charge storage layer and each of the plurality of first semiconductor regions; a second insulating film provided between the charge storage layer and each of the plurality of control gate electrodes; and a silicon-containing layer in contact with part of a side wall of each of the plurality of control gate electrodes, and the silicon-containing layer having a gradient in a silicon concentration in a direction crossing the second direction.

Hereinbelow, embodiments are described with reference to the drawings. In the following description, identical components are marked with the same reference numerals, and a description of components once described is omitted as appropriate.

First Embodiment

FIG. 1 is a schematic plan view of a nonvolatile semiconductor memory device according to a first embodiment.

FIG. 1 shows a planar layout in a memory cell unit of a NAND flash memory.

A nonvolatile semiconductor memory device 1 according to the first embodiment includes a plurality of semiconductor regions 11 (first semiconductor regions) and a plurality of control gate electrodes 60. The plurality of semiconductor regions 11 extend in the Y-direction (a first direction), and are arranged in the X-direction crossing the Y-direction.

The plurality of control gate electrodes 60 extend in the X-direction (a second direction) different from the Y-direction, and are arranged in the Y-direction crossing the X-direction. The plurality of control gate electrodes 60 are provided on the upper side of the plurality of semiconductor regions 11. In the nonvolatile semiconductor memory device 1, each of the plurality of semiconductor regions 11 and each of the plurality of control gate electrodes 60 cross.

Each of the plurality of semiconductor regions 11 forms part of a NAND string. Each of the plurality of semiconductor regions 11 is element-isolated. The control gate electrode 60 may be referred to as a word line.

In the nonvolatile semiconductor memory device 1, a transistor is disposed in a position where each of the plurality of semiconductor regions 11 and each of the plurality of control gate electrodes 60 cross (described later). The transistors are arranged two-dimensionally in the X-Y plane. Each transistor functions as a memory cell of the nonvolatile semiconductor memory device 1.

FIG. 2 is schematic cross-sectional views of the nonvolatile semiconductor memory device according to the first embodiment. FIG. 2A is a schematic cross-sectional view corresponding to line A-A' of FIG. 1, and FIG. 2B is a schematic cross-sectional view corresponding to line B-B' of FIG. 1. In FIGS. 2A and 2B, the positive direction of the Z-axis is the upward direction, and the negative direction is the downward direction.

The nonvolatile semiconductor memory device 1 includes, in addition to the semiconductor regions 11 and the control gate electrodes 60 described above, a gate insulating film 20 (a first insulating film), a charge storage layer 30, a gate insulating film 40 (a second insulating film), and an element isolation region 50.

The nonvolatile semiconductor memory device 1 includes a transistor including the semiconductor region 11, the gate insulating film 20, the charge storage layer 30, the gate insulating film 40, and the control gate electrode 60.

Each of the plurality of semiconductor regions 11 is partitioned by the element isolation region 50 in a semiconductor layer 10. For example, each of the plurality of semiconductor regions 11 extending in the Y-direction is partitioned by the element isolation region 50 in the semiconductor layer 10. Each of the plurality of semiconductor regions 11 is an active area that the transistor of the nonvolatile semiconductor memory device 1 occupies.

The gate insulating film 20 is provided between each of the plurality of semiconductor regions 11 and the charge storage layer 30. The upper surface 20u of the gate insulating film 20 is located lower than the lower surface 40d of the gate insulating film 40. The gate insulating film 20 is a tunnel insulating film that allows a charge (e.g. electrons) to tunnel between the semiconductor region 11 and the charge storage layer 30.

The charge storage layer 30 is provided in a position where each of the plurality of semiconductor regions 11 and each of the plurality of control gate electrodes 60 cross. The charge storage layer 30 is provided on the gate insulating film 20. The charge storage layer 30 can store a charge that has tunneled from the semiconductor region 11 via the gate insulating film 20. The charge storage layer 30 may be referred to as a floating gate layer. The external shape of the charge storage layer 30 is, for example, a rectangle in the A-A' cross section and the B-B' cross section, and is a columnar shape.

The gate insulating film 40 is provided between each of the plurality of control gate electrodes 60 and the charge storage layer 30. The gate insulating film 40 covers the upper end 30u of the charge storage layer 30 and part of the side wall 30w of the charge storage layer 30. For example, in the X-Z cross section (FIG. 2A), the gate insulating film 40 covers charge storage layer 30 other than the portion where the element isolation region 50 is in contact with the charge storage layer 30. In the Y-Z cross section (FIG. 2B), the side wall 30w of the charge storage layer 30 is covered with an interlayer insulating film 70.

That is, the upper end 30u and the side wall 30w of the charge storage layer 30 are covered with an insulator, and the charge stored in the charge storage layer 30 is prevented from leaking to the control gate electrode 60. The gate insulating film 40 may be referred to as a charge block layer. It is not necessary to completely fill the portion between memory cells with the interlayer insulating film 70, and a space may be provided in the interlayer insulating film 70 in order to reduce parasitic capacitance.

The control gate electrode 60 covers part of the charge storage layer 30 via the gate insulating film 40 in the X-Z cross section (FIG. 2A). For example, the control gate electrode 60 covers the upper end 30u and part of the side wall 30w of the charge storage layer 30 via the gate insulating film 40. The control gate electrode 60 is provided on the gate insulating film 40 in the Y-Z cross section (FIG. 2B). The control gate electrode 60 functions as a gate electrode for controlling the transistor.

Each of the plurality of control gate electrodes 60 includes a polysilicon-containing layer 60a and a metal-containing layer 60b provided on the polysilicon-containing layer 60a. The polysilicon-containing layer 60a may include an impurity element.

The polysilicon-containing layer 60a has a first portion that has a width d1 in the Y-direction crossing the X-direction and is in contact with the metal-containing layer 60b and a second portion that has a width d2 wider than the width d1 and is provided between the first portion and the gate insulating film 40. In other words, there is a level difference on the side wall of the polysilicon-containing layer 60a.

The metal-containing layer 60b includes tungsten (W). The metal-containing layer 60b may be a stacked film of tungsten nitride (WN)/tungsten (W) from the lower side, or a stacked film of titanium nitride (TiN)/tungsten from the lower side, for example. When a tungsten nitride layer or a titanium nitride layer is used as the lower layer of the metal-containing layer 60b, the tungsten nitride layer or the titanium nitride layer serves as a barrier layer to suppress the diffusion of silicon from the polysilicon-containing layer 60a to the metal-containing layer 60b. Thereby, the production of tungsten silicide in the metal-containing layer 60b is suppressed, and the metal-containing layer 60b maintains its resistivity.

In the Y-Z cross section (FIG. 2B), the side wall 60bw of the metal-containing layer 60b is covered with a silicon-containing layer 71. At least part of the silicon-containing layer 71 is oxidized or nitrided. The silicon-containing layer 71 is in contact with part of the polysilicon-containing layer 60a. That is, the silicon-containing layer 71 is in contact with part of the side wall of each of the plurality of control gate electrodes 60.

In the silicon-containing layer 71, there may be a gradient in the silicon concentration in the Y-direction. For example, in the silicon-containing layer 71, the silicon concentration is lower on the side of the surface of the silicon-containing layer 71 than on the side of the junction between the side wall 60bw of the metal-containing layer 60b and the silicon-containing layer 71. In other words, in the silicon-containing layer 71, the concentration of silicon becomes lower toward its surface side. The reason why such a concentration gradient is formed is described later.

An insulating film 72 is provided on each of the plurality of control gate electrodes 60. The insulating film 72 is what is called a cap layer.

FIG. 2A shows a state where the element isolation region 50 is provided between adjacent ones of the plurality of semiconductor regions 11, as an example. The element isolation region 50 is in contact with the gate insulating film 20 and the charge storage layer 30, for example. The upper end 50u of the element isolation region 50 is located lower than the upper end 30u of the charge storage layer 30. The upper surface 11u of the semiconductor region 11 is located lower than the upper end 50u of the element isolation region 50. However, in the case where an air gap is formed in the position of the element isolation region 50, the upper end 50u of the element isolation region 50 may be located on the lower side of the upper surface 11u of the semiconductor region 11.

The material of the semiconductor layer 10 (or the semiconductor region 11) is a p-type (first conductivity type) semiconductor crystal, for example. Silicon (Si) is given as the semiconductor, for example.

The material of the gate insulating film 20 is silicon oxide ($SiO_2$), silicon nitride ($Si_3N_4$), or the like, for example. The gate insulating film 20 may be a single layer of a silicon oxide film or a silicon nitride film, or may be a film in which a silicon oxide film or a silicon nitride film is stacked, for example.

The material of the charge storage layer 30 is a semiconductor material such as Si and a Si-based compound, a material other than these (e.g. a metal or an insulating film), or a stacked film of them, for example. The material of the charge storage layer 30 is a semiconductor containing an n-type (second conductivity type) impurity, a metal, a metal compound, or the like, for example. As this material, for example, amorphous silicon (a-Si), polysilicon (poly-Si), silicon germanium (SiGe), silicon nitride ($Si_xN_y$), hafnium oxide ($HfO_x$), and the like are given.

The gate insulating film 40 may be a film in which a silicon oxide film or a silicon nitride film is stacked, for example. The gate insulating film 40 may be what is called an ONO film (silicon oxide film/silicon nitride film/silicon oxide film), for example. Alternatively, the gate insulating film 40 may be a single layer of a silicon nitride film or a silicon oxide film. The gate insulating film 40 may be a metal oxide film or a metal nitride film. In the first embodiment, the description below is given using an example in which the gate insulating film 40 includes a silicon nitride film.

The material of the element isolation region 50 and the interlayer insulating film 70 is silicon oxide ($SiO_2$), for example. The insulating film 72 includes silicon nitride.

As the impurity element, for example, boron (B) is given as the p-type impurity, and phosphorus (P) and arsenic (As) are given as the n-type impurity.

The manufacturing process of the nonvolatile semiconductor memory device 1 will now be described.

FIG. 3A to FIG. 7 are schematic cross-sectional views showing the manufacturing process of the nonvolatile semiconductor memory device according to the first embodiment.

First, in the X-Z cross section, the state shown in FIG. 3A is formed beforehand. The state shown in FIG. 3A is the same as the state shown in FIG. 2A. In other words, a plurality of semiconductor regions 11 partitioned by the element isolation region 50 are formed in the semiconductor layer 10. The gate insulating film 20 and the charge storage layer 30 are formed on each of the plurality of semiconductor regions 11. The gate insulating film 40 that covers the upper end 30u and part of the side wall 30w of the charge storage layer 30 is formed. Subsequently, a control gate electrode 60L and the insulating film 72 are formed on the upper side of the gate insulating film 40.

FIG. 3B shows the Y-Z cross section at this stage. In the Y-Z cross section, a stacked body 15 in which a plurality of layers are stacked in the Z-direction is formed. For example, in the stacked body 15, the gate insulating film 20 is provided on the semiconductor layer 10. The charge storage layer 30 is provided on the gate insulating film 20. The gate insulating film 40 is provided on the charge storage layer 30. The control gate electrode layer 60L is provided on the gate insulating film 40. The control gate electrode layer 60L includes the polysilicon-containing layer 60a and the metal-containing layer 60b provided on the polysilicon-containing layer 60a. At this stage, the control gate electrode layer 60L is not separated in the Y-direction. The insulating film 72 is provided on the control gate electrode layer 60L.

In the subsequent manufacturing process, the X-Z cross section maintains the state of FIG. 3A in the stacked body on the lower side of the insulating film 72. Thus, hereinafter the X-Z cross section is not illustrated, and a cross-sectional view corresponding to the Y-Z cross section is illustrated.

Next, as shown in FIG. 4A, a plurality of mask layers 90 extending in the X-direction and arranged in the Y-direction crossing the X-direction are formed on the stacked body 15.

Next, as shown in FIG. 4B, etching processing is performed on the insulating film 72 exposed from the plurality of mask layers 90 and on the metal-containing layer 60b under the insulating film 72. Thereby, a plurality of insulating films 72 extending in the X-direction and arranged in the Y-direction crossing the X-direction and a plurality of metal-containing layers 60b extending in the X-direction and arranged in the Y-direction crossing the X-direction are formed. Trenches 95 extending in the X-direction and arranged in the Y-direction are formed on the stacked body 15.

At this stage, the side wall 60bw of each of the plurality of metal-containing layers 60b is exposed. The polysilicon-containing layer 60a is exposed between adjacent metal-containing layers 60b.

Figure 5A:
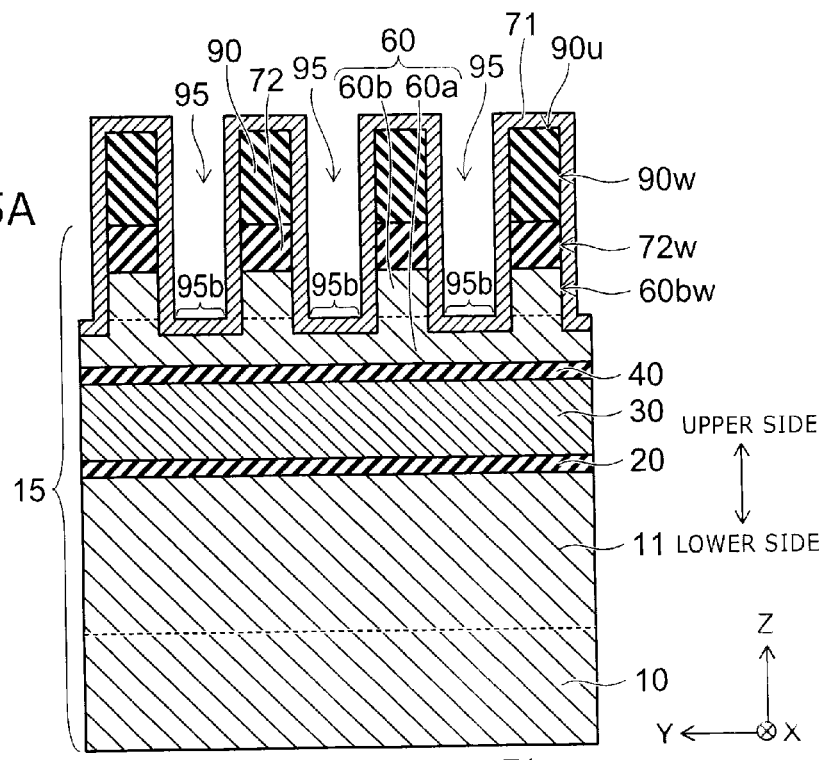

Next, as shown in FIG. 5A, the silicon-containing layer 71 is formed along the upper end 90u and the side wall 90w of the mask layer 90, the side wall 72w of the insulating film 72, the side wall 60bw of the metal-containing layer 60b, and the surface of the polysilicon-containing layer 60a. Thereby, the side wall 60bw of each of the plurality of metal-containing layers 60b is covered with the silicon-containing layer 71. The silicon-containing layer 71 may be referred to as a cover layer. The silicon-containing layer 71 includes amorphous silicon (a-Si), for example. The silicon-containing layer 71 is formed by CVD (chemical vapor deposition), for example. After the silicon-containing layer 71 is formed, the trenches 95 extending in the X-direction and arranged in the Y-direction still remain on the stacked body 15.

Figure 5B:
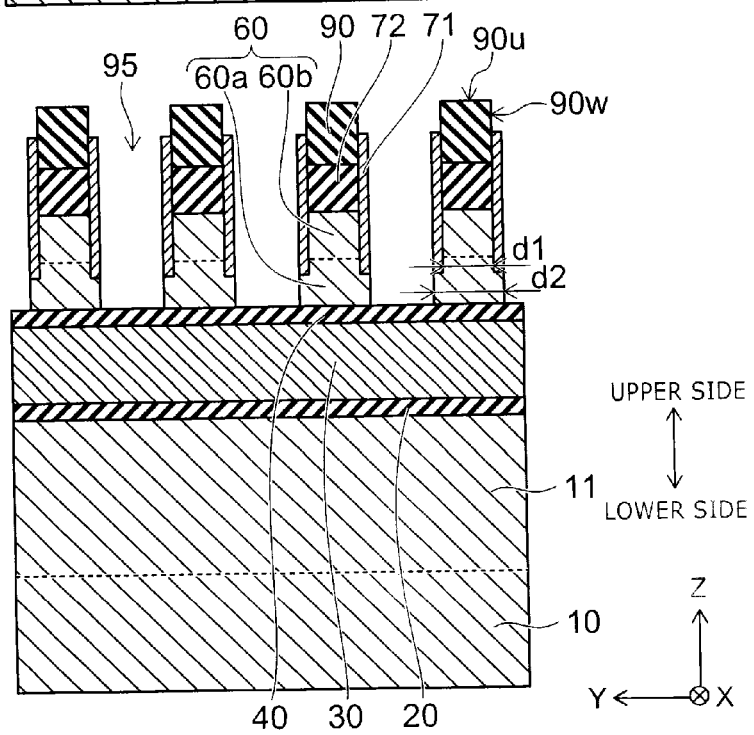

Next, as shown in FIG. 5B, anisotropic etching processing is performed on the bottom 95b of the trench 95 while the side wall 60bw of the metal-containing layer 60b is covered with the silicon-containing layer 71. By the anisotropic etching processing, the bottom 95b of the trench 95 and the polysilicon-containing layer 60a under the bottom 95b of the trench 95 are removed. Thereby, a plurality of polysilicon-containing layers 60a extending in the X-direction and arranged in the Y-direction crossing the X-direction are formed.

In the anisotropic etching, an etchant gas whereby silicon is preferentially removed is supplied to the silicon-containing layer 71 and the polysilicon-containing layer 60a. By the anisotropic etching, the silicon-containing layer 71 that has been covering the upper end 90u of the mask layer 90 and part of the silicon-containing layer 71 that has been covering the side wall 90w of the mask layer 90 are removed.

Since the polysilicon-containing layer 60a under the bottom 95b of the trench 95 is removed, a level difference is formed on the side wall of the polysilicon-containing layer 60a. That is, the polysilicon-containing layer 60a has a portion having the width d1 in the Y-direction and a portion having the width d2 in the Y-direction.

Figure 6A:
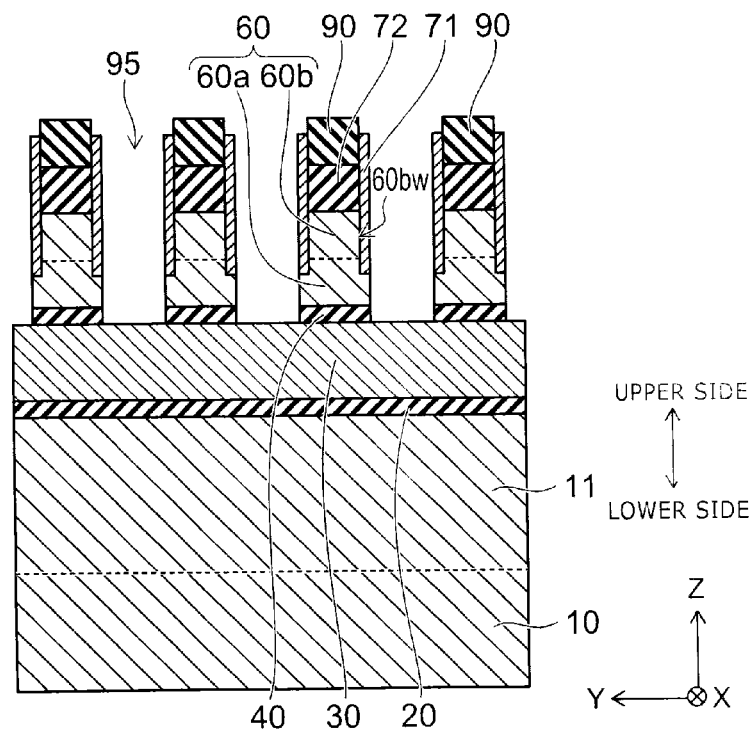

Next, as shown in FIG. 6A, the gate insulating film 40 is removed by etching processing while the side wall 60bw of the metal-containing layer 60b is covered with the silicon-containing layer 71. Herein, the gate insulating film 40 exposed between adjacent polysilicon-containing layers 60a is removed by the etching processing.

In the etching processing, in addition to etching the gate insulating film 40 exposed between adjacent polysilicon-containing layers 60a, the gate insulating film 40 in contact with the side wall 30w of the charge storage layer 30 shown in FIG. 3A is etched. Thus, when etching the gate insulating film 40, etching processing in which isotropy is added to anisotropic etching is employed.

In the etching processing, an etchant gas whereby a silicon nitride film or a silicon oxide film is removed more preferentially than silicon is supplied to the gate insulating film 40. Thereby, the gate insulating film 40 is etched preferentially, and a plurality of gate insulating films 40 extending in the X-direction and arranged in the Y-direction crossing the X-direction are formed.

Figure 6B:
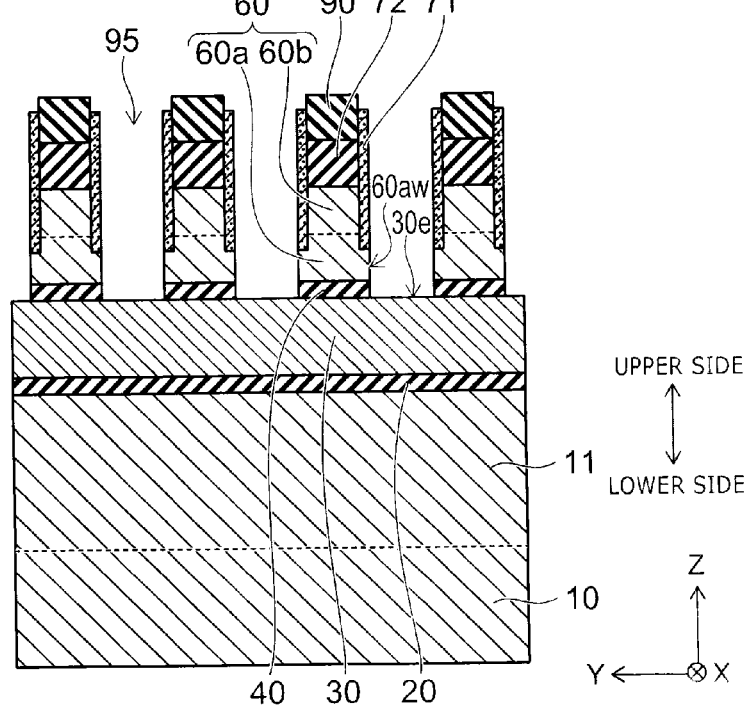

Next, as shown in FIG. 6B, at least part of the silicon-containing layer 71 is nitrided or oxidized, or the silicon-containing layer 71 is nitrided and oxidized. In other words, at least part of the silicon-containing layer 71 is changed to silicon nitride ($SiN_x$) or silicon oxide ($SiO_y$), or at least part of the silicon-containing layer 71 is changed to silicon nitride oxide ($SiN_xO_y$).

Here, the nitridation is performed by plasma nitridation. The oxidation is performed by a method of one of plasma oxidation, thermal oxidation, and selective oxidation. In the selective oxidation, a mixed gas of oxygen gas (5 wt %)/hydrogen gas (95 wt %) is used as the oxidizing atmosphere, for example.

Since the surface of the silicon-containing layer 71 is exposed to the gas used for nitridation or oxidation (e.g. nitrogen, ammonia, oxygen, etc.), the nitradation or the oxidation may proceed more on the surface side of the silicon-containing layer 71. In this case, in the silicon-containing layer 71, a gradient is produced in the silicon concentration in the Y-direction. For example, in the silicon-containing layer 71, the concentration of silicon becomes lower toward its surface side.

By the nitridation treatment or the oxidation treatment in this stage, the outer layer of the side wall 60aw of the polysilicon-containing layer 60a other than the silicon-containing layer 71 and the outer layer of the exposed surface 30e may be nitrided or oxidized, or may be nitrided and oxidized. The layer thickness of the nitrided layer or the oxidized layer formed by nitridation treatment or oxidation treatment may be thinner in the polysilicon-containing layer 60a, which is crystallized, than in the silicon-containing layer 71 in an amorphous state.

Figure 7:
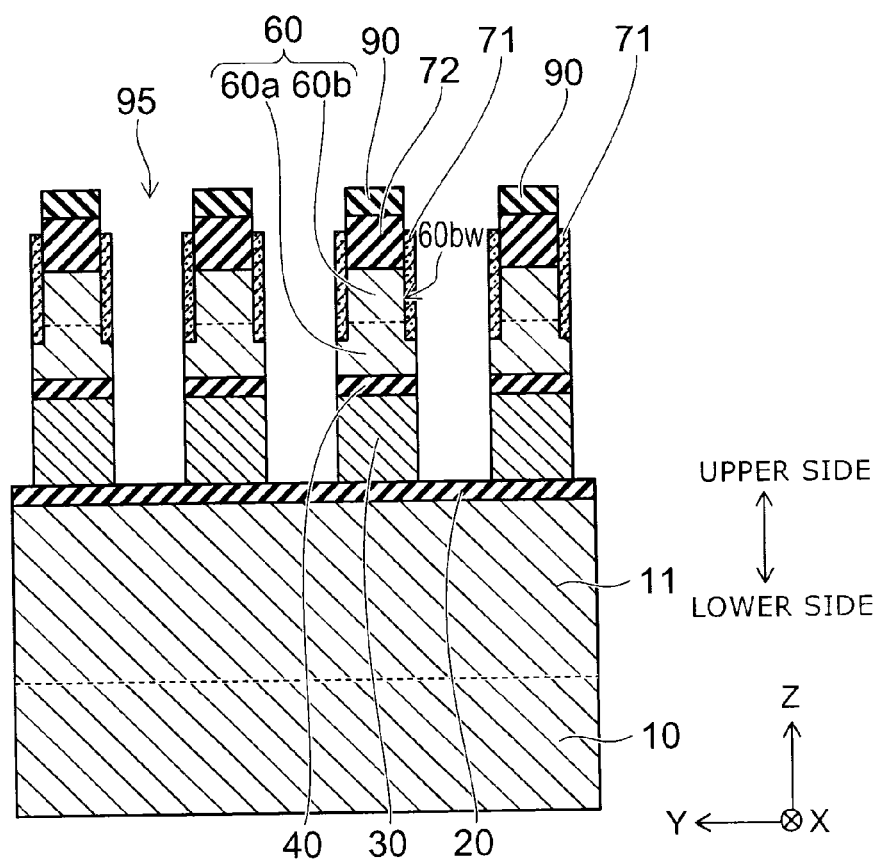

Next, as shown in FIG. 7, etching processing is performed on the charge storage layer 30 exposed from the mask layer 90 while the side wall 60bw of the metal-containing layer 60b is covered with the silicon-containing layer 71. Thereby, a plurality of charge storage layers 30 extending in the X-direction and arranged in the Y-direction crossing the X-direction are formed. After that, the mask layer 90 is removed. The interlayer insulating film 70 may be formed between memory cells.

By such a manufacturing process, the nonvolatile semiconductor memory device 1 shown in FIG. 2A and FIG. 2B is formed.

After each etching processing, cleaning treatment (e.g. acid cleaning, alkali cleaning, etc.) may be performed in the trench 95 so that the components removed by the etching are not left as residues.

As described above, the control gate electrode 60 includes the metal-containing layer 60b. Hence, if the side wall 60bw of the metal-containing layer 60b is not covered with a cover layer after the metal-containing layer 60b is processed into a line configuration, the subsequent etching processing process of the charge storage layer 30 may cause scattering of metal from the side surface of the metal-containing layer 60b, or the subsequent cleaning process (e.g. acid cleaning) may cause eluting of metal components from the metal-containing layer 60b.

Thus, in the first embodiment, after the control gate electrode is processed into a line configuration by dry etching, the side wall 60bw of the metal-containing layer 60b is covered with the silicon-containing layer 71.

Before effects of the first embodiment are described, the manufacturing process of a volatile semiconductor memory device according to a reference example is described.

Figure 8A:
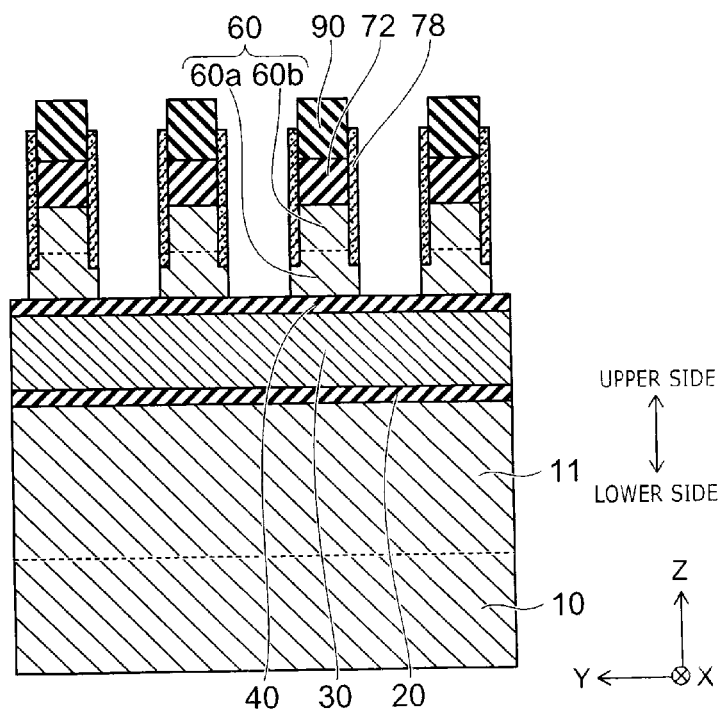
FIG. 8A and FIG. 8B are schematic cross-sectional views showing the manufacturing process of a nonvolatile semiconductor memory device according to a reference example.
Figure 8B:
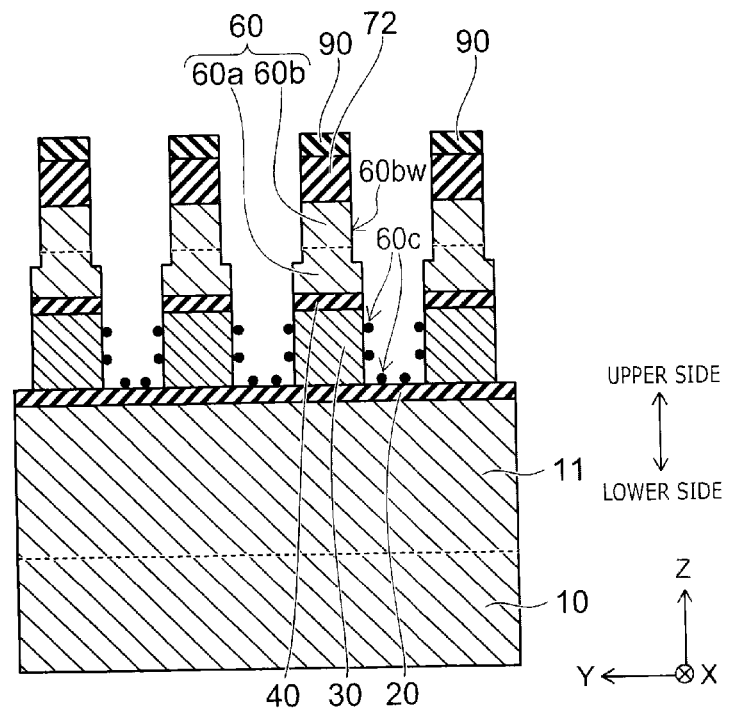

FIG. 8A and FIG. 8B are schematic cross-sectional views showing the manufacturing process of a nonvolatile semiconductor memory device according to a reference example.

In the reference example, a silicon nitride layer 78 is illustrated as a cover layer covering the side wall 60bw of the metal-containing layer 60b.

As shown in FIG. 8A, in the case where the cover layer is the silicon nitride layer 78, it is highly probable that also the cover layer 78 will be etched when the gate insulating film 40 is processed by etching. This is because both the material of the gate insulating film 40 and the material of the silicon nitride layer 78 include silicon nitride.

Furthermore, when the gate insulating film 40 is processed by etching, etching processing in which isotropy is added to anisotropic etching is employed. Thus, it is highly probable that even the silicon nitride layer 78 formed on the side wall 60bw of the metal-containing layer 60b will be removed when the gate insulating film 40 is processed by etching.

FIG. 8B shows a state where the silicon nitride layer 78 has been removed. In the case where the silicon nitride layer 78 has been removed in the process from FIG. 8A to FIG. 8B, metal components (e.g. tungsten atoms) may be scattered from the side surface of the metal-containing layer 60b in the etching processing process of the charge storage layer 30. Furthermore, when cleaning treatment such as acid cleaning is performed from the state shown in FIG. 8B, the side wall 60bw of the metal-containing layer 60 may be exposed to the cleaning liquid, and metal components (e.g. tungsten ions) may elute from the metal-containing layer 60b.

FIG. 8B shows a state where metal components are re-attached onto the side wall of the charge storage layer 30 and the gate insulating film 20 and are left as residues 60c, for example. The residue 60c includes a metal component. Therefore, the residue 60c is a factor in the characteristic degradation and reliability degradation of the nonvolatile semiconductor memory device.

In contrast, in the first embodiment, as shown in FIG. 6A, the gate insulating film 40 under the polysilicon-containing layer 60a is removed by etching processing while the side wall 60bw of the metal-containing layer 60b is covered with the silicon-containing layer 71.

Here, the components of the silicon-containing layer 71 and the components of the gate insulating film 40 are different. Thus, an etchant gas whereby only the gate insulating film 40 is preferentially removed can be used to etch only the gate insulating film 40 preferentially. Therefore, after the gate insulating film 40 is processed by etching, the silicon-containing layer 71 remains on the side wall 60bw of the metal-containing layer 60b surely.

The silicon-containing layer 71 is transitioned from this state to an insulating layer or a state near an insulating layer in the stage shown in FIG. 6B. Therefore, even when cleaning treatment is performed after that, the side wall 60bw of the metal-containing layer 60b is not exposed to the cleaning liquid. Here, the cleaning liquid is a dilute hydrofluoric acid solution, for example. Thus, metal components do not elute from the metal-containing layer 60b, either. In the case where the insulating layer includes a silicon nitride layer, the resistance of the insulating layer to the cleaning liquid is high. That is, by the first embodiment, the occurrence of the residue 60c is suppressed. Thereby, the characteristic degradation and reliability degradation of the nonvolatile semiconductor memory device are less likely to occur.

By transitioning at least part of the silicon-containing layer 71 to an insulating layer, amorphous silicon components are less likely to remain on both sides of the metal-containing layer 60b and the insulating film 72 (cap layer). Thereby, there are advantages that the parasitic capacitance between adjacent control gate electrodes can be reduced and a short circuit can be prevented.

Second Embodiment

The method for forming a nonvolatile semiconductor memory device is not limited to the method of the first embodiment.

FIG. 9A to FIG. 11B are schematic cross-sectional views showing the manufacturing process of a nonvolatile semiconductor memory device according to a second embodiment.

Figure 9A:
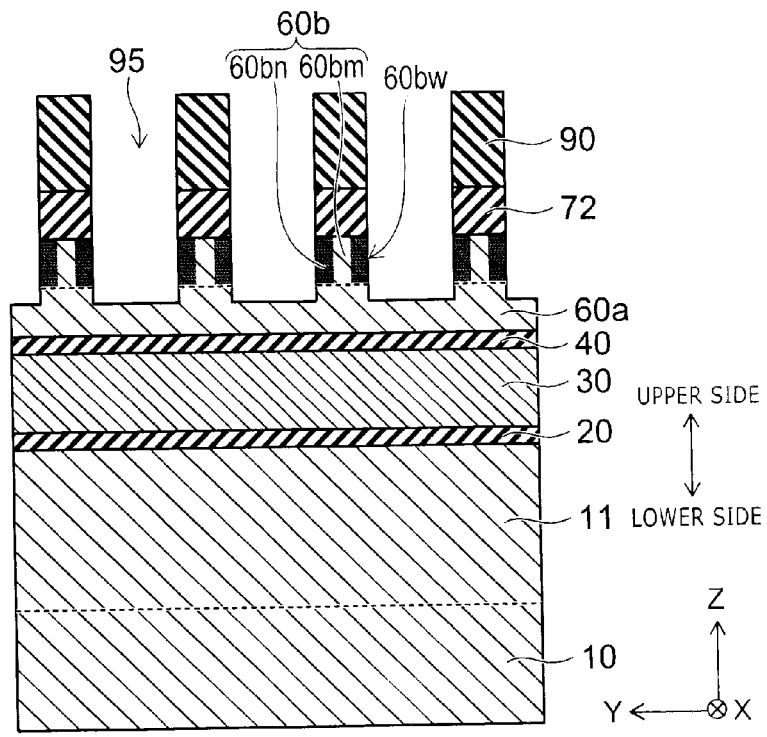
FIG. 9A to FIG. 11B are schematic cross-sectional views showing the manufacturing process of a nonvolatile semiconductor memory device according to a second embodiment.

First, FIG. 9A shows a state after nitridation treatment has been performed on the metal-containing layer 60b from the state shown in FIG. 4B. In other words, at least part of the metal-containing layer 60b is nitrided from the state shown in FIG. 4B to obtain the state shown in FIG. 9A. At least part of the metal-containing layer 60b may be oxidized, or may be nitrided and oxidized. Herein, nitridation is illustrated. The nitridation is performed by plasma nitridation.

Since the side wall 60bw of the metal-containing layer 60b is exposed to the gas used for nitridation, the nitridation may proceed more on the side wall side of the metal-containing layer 60b. Therefore, after the nitridation, the metal-containing layer 60b has a nitride-containing layer 60bn on the side wall side and a metal-containing layer 60bm.

Figure 9B:
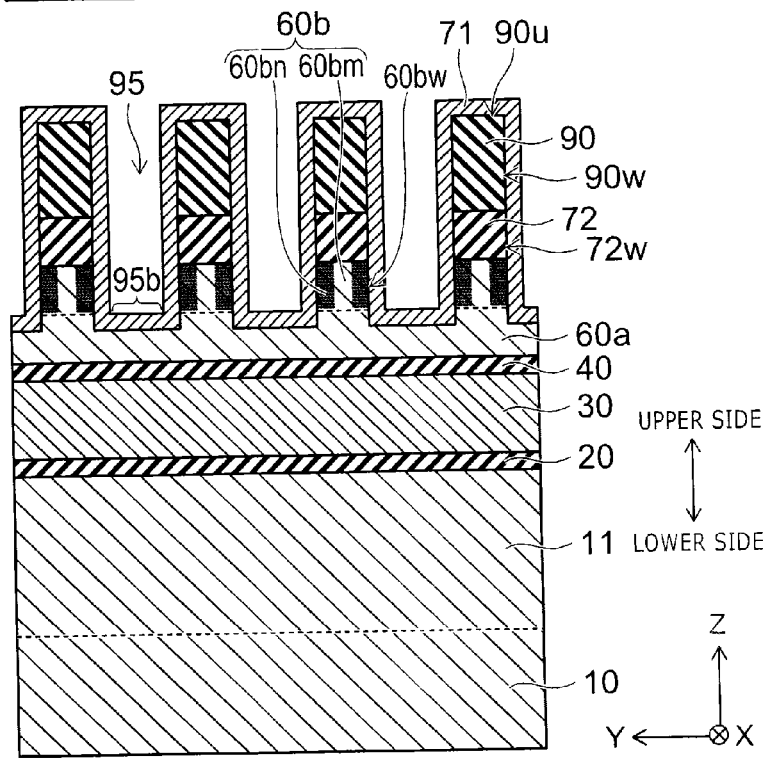

Next, as shown in FIG. 9B, the silicon-containing layer 71 is formed along the upper end 90u and the side wall 90w of the mask layer 90, the side wall 72w of the insulating film 72, the side wall 60bw of the metal-containing layer 60b, and the surface of the polysilicon-containing layer 60a. Thereby, the side wall 60bw of each of the plurality of metal-containing layers 60b is covered with the silicon-containing layer 71. The silicon-containing layer 71 includes amorphous silicon (a-Si), for example.

Figure 10A:
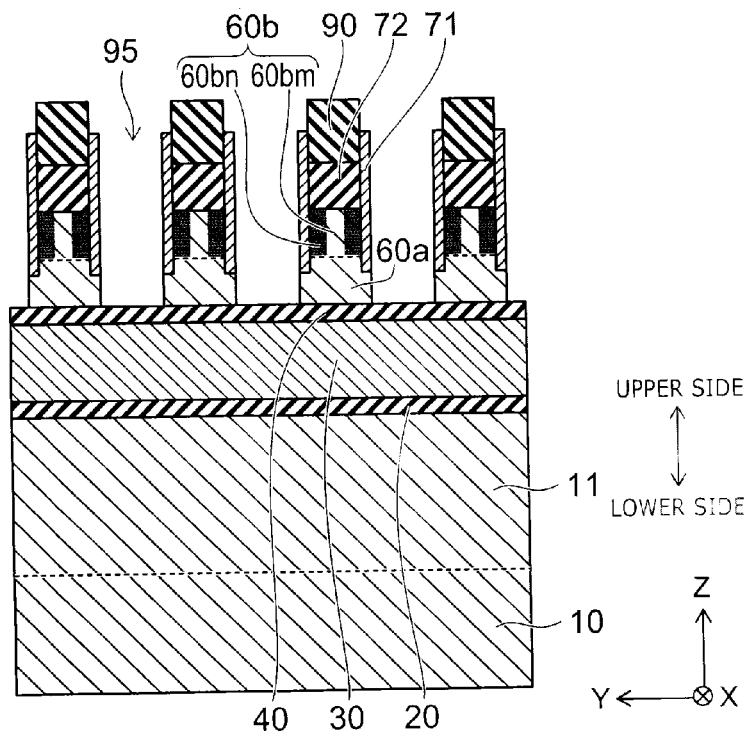

Subsequently, anisotropic etching processing is performed on the bottom 95b of the trench 95 while the side wall 60bw of the metal-containing layer 60b is covered with the silicon-containing layer 71. By the anisotropic etching processing, the bottom 95b of the trench 95 and the polysilicon-containing layer 60a under the bottom 95b of the trench 95 are removed. Thereby, a plurality of polysilicon-containing layers 60a extending in the X-direction and arranged in the Y-direction crossing the X-direction are formed. FIG. 10A shows this state.

In the anisotropic etching, an etchant gas whereby silicon is preferentially removed is supplied to the silicon-containing layer 71 and the polysilicon-containing layer 60a. By the anisotropic etching, the silicon-containing layer 71 that has been covering the upper end 90u of the mask layer 90 and part of the silicon-containing layer 71 that has been covering the side wall 90w of the mask layer 90 are removed.

Since the polysilicon-containing layer 60a under the bottom 95b of the trench 95 is removed, a level difference is formed on the side wall of the polysilicon-containing layer 60a.

Figure 10B:
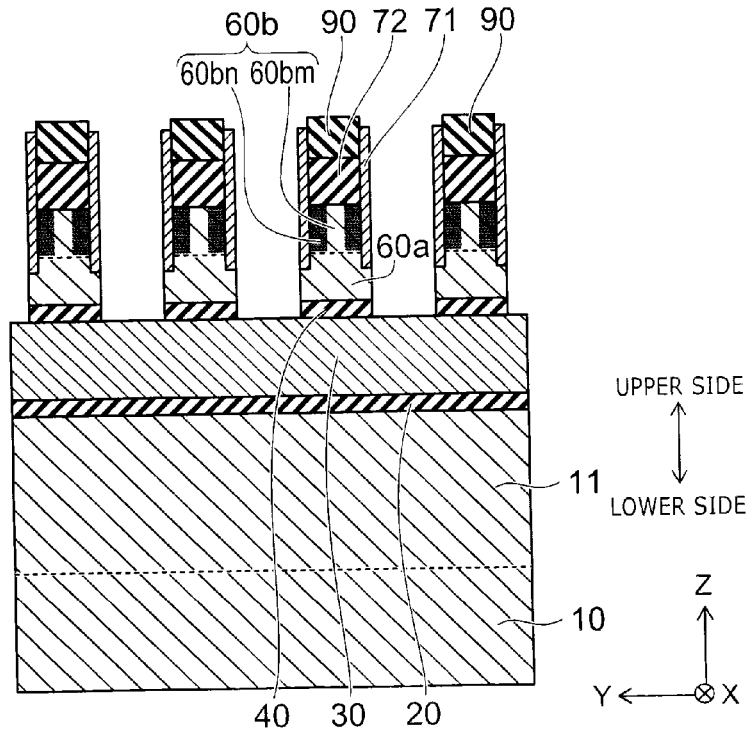

Next, as shown in FIG. 10B, the gate insulating film 40 is removed by etching processing while the side wall 60bw of the metal-containing layer 60b is covered with the silicon-containing layer 71. Herein, the gate insulating film 40 exposed between adjacent polysilicon-containing layers 60a is removed by the etching processing.

In the etching processing, in addition to etching the gate insulating film 40 exposed between adjacent polysilicon-containing layers 60a, the gate insulating film 40 in contact with the side wall 30w of the charge storage layer 30 shown in FIG. 3A is etched. Thus, when etching the gate insulating film 40, etching processing in which isotropy is added to anisotropic etching is employed.

In the etching processing, an etchant gas whereby a silicon nitride film or a silicon oxide film is removed more preferentially than silicon is supplied to the gate insulating film 40. Thereby, the gate insulating film 40 is etched preferentially, and a plurality of gate insulating films 40 extending in the X-direction and arranged in the Y-direction crossing the X-direction are formed.

Figure 11A:
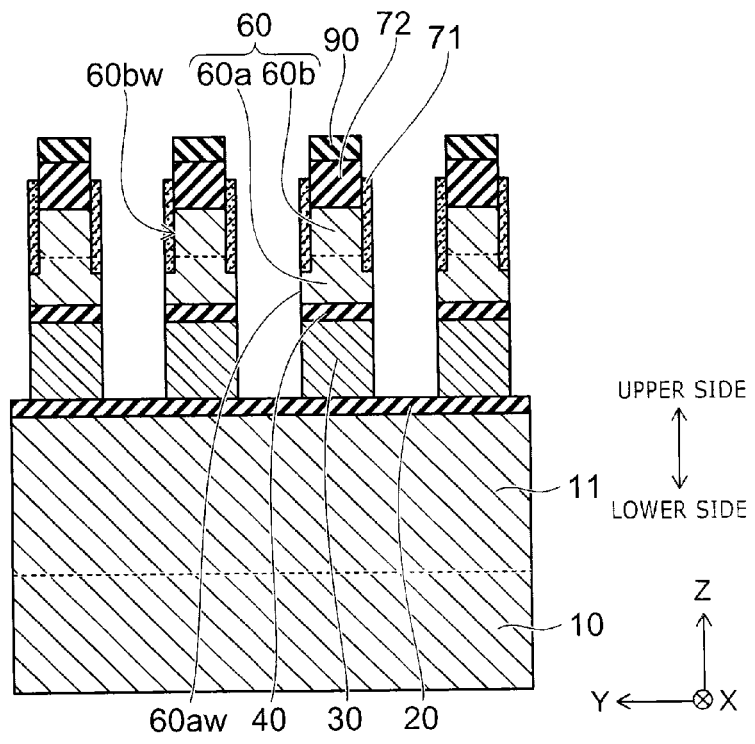

Next, as shown in FIG. 11A, etching processing is performed on the charge storage layer 30 exposed from the mask layer 90 while the side wall 60bw of the metal-containing layer 60b is covered with the silicon-containing layer 71. Thereby, a plurality of charge storage layers 30 extending in the X-direction and arranged in the Y-direction crossing the X-direction are formed. After that, cleaning treatment (e.g. acid cleaning, alkali cleaning, etc.) may be performed in the trench 95 so that the components removed by the etching are not left as residues. The mask layer 90 may be removed in the cleaning treatment.

Figure 11B:
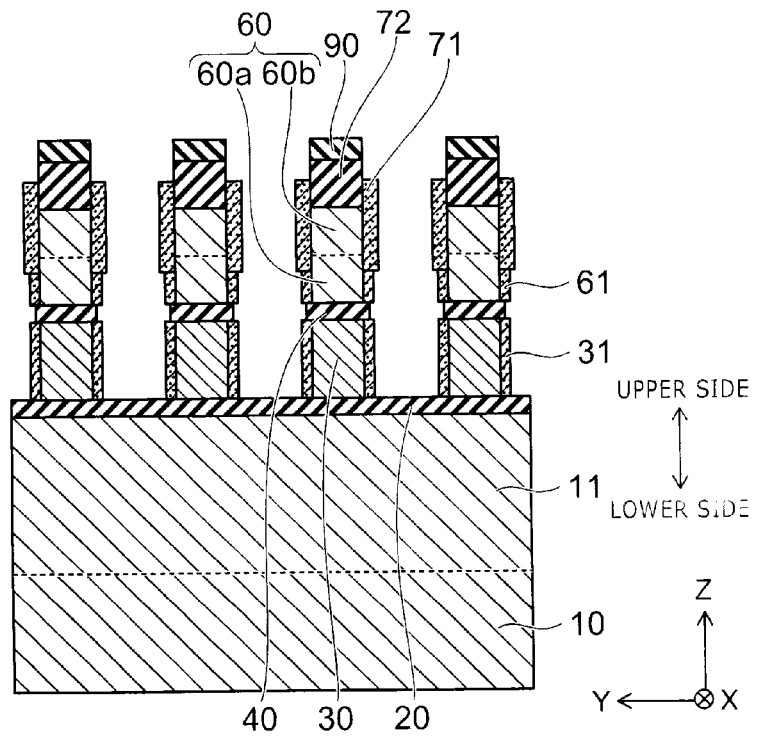

Next, as shown in FIG. 11B, for example, selective oxidation treatment by plasma oxidation is performed, and at least part of the silicon-containing layer 71, the side surface 60aw of the polysilicon-containing layer (control gate electrode) 60a, and the side surface 30w of the charge storage layer 30 are changed to silicon oxide ($SiO_x$). Thereby, a silicon oxide film 31 is formed on the side surface of the charge storage layer 30, and a silicon oxide film 61 is formed on the side surface of the polysilicon-containing layer 60a.

At this time, since the silicon-containing layer 71, which is mainly made of amorphous silicon, is oxidized more easily than the polysilicon-containing layer 60a and the charge storage layer 30, which are crystallized (polycrystallized), the silicon oxide film layer formed on the surface of the silicon-containing layer 71 is formed thicker. At this time, since the surface of the silicon-containing layer 71 is exposed to the gas used for oxidation (oxygen radicals etc.), the oxidation may proceed more on the surface side of the silicon-containing layer 71. In this case, in the silicon-containing layer 71, a gradient is produced in the silicon concentration in the Y-direction. For example, in the silicon-containing layer 71, the concentration of silicon becomes lower toward its surface side.

Due to the plasma oxidation treatment, the subsequent heat treatment at high temperature for impurity activation, or the like, nitrogen is released from the nitride-containing layer 60bn on the side surface side of the metal-containing layer control gate electrode 60b, and a region in contact with the metal-containing control gate electrode of the silicon-containing layer 71 is changed to silicon nitride ($SiN_x$).

Here, for the nitridation, a method in which the silicon-containing layer 71 is heated to nitride at least part of the silicon-containing layer 71 is employed. By heating the silicon-containing layer 71, nitrogen contained in the nitride-containing layer 60bn diffuses to the silicon-containing layer 71, and at least part of the silicon-containing layer 71 is nitrided.

The nitridation proceeds from the junction between the silicon-containing layer 71 and the nitride-containing layer 60bn. Accordingly, in the silicon-containing layer 71, the silicon concentration has become higher on the side of the surface of the silicon-containing layer 71 than on the side of the junction between the side wall 60bw of the metal-containing layer 60b and the silicon-containing layer 71. In other words, in the silicon-containing layer 71, the concentration of silicon has become higher toward its surface side.

After that, the interlayer insulating film 70 may be formed between memory cells.

The nonvolatile semiconductor memory device 1 may be formed by such a manufacturing process.

The second embodiment exhibits the same effects as the first embodiment. Furthermore, in the second embodiment, when the silicon-containing layer 71 is nitrided, the nitridation is caused to proceed from the junction between the silicon-containing layer 71 and the nitride-containing layer 60bn. Therefore, a silicon nitride layer near the stoichiometric ratio has been formed at the junction between the side wall 60bw of the metal-containing layer 60b and the silicon-containing layer 71. The silicon nitride layer serves as a barrier layer to suppress the diffusion of silicon in the silicon-containing layer 71 to the metal-containing layer 60b. Thereby, the production of tungsten silicide at the junction mentioned above is suppressed, and the resistivity increase of the metal-containing layer 60b is suppressed.

The term "on" in "a portion A is provided on a portion B" refers to the case where the portion A is provided on the portion B such that the portion A is in contact with the portion B and the case where the portion A is provided above the portion B such that the portion A is not in contact with the portion B.

The term "on" in "a portion A is provided on a portion B" refers to the case where the portion A is provided under the portion B such that the portion A and the portion B are turned upside down and the portion A comes abreast of the portion B. This is because that, if the semiconductor device according to each of embodiments is rotated, the structure of the semiconductor device remains unchanged before and after rotation.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
   a plurality of first semiconductor regions extending in a first direction, and the plurality of first semiconductor regions being arranged in a direction crossing the first direction;
   a plurality of control gate electrodes provided on an upper side of the plurality of first semiconductor regions, the plurality of control gate electrodes extending in a second direction different from the first direction, and the plurality of control gate electrodes being arranged in a direction crossing the second direction;
   a charge storage layer provided in a position, and each of the plurality of first semiconductor regions and each of the plurality of control gate electrodes cross in the position;
   a first insulating film provided between the charge storage layer and each of the plurality of first semiconductor regions;
   a second insulating film provided between the charge storage layer and each of the plurality of control gate electrodes; and
   a silicon-containing layer in contact with part of a side wall of each of the plurality of control gate electrodes, and the silicon-containing layer having a gradient in a silicon concentration in a direction crossing the second direction,
   each of the plurality of control gate electrodes including a polysilicon-containing layer and a metal-containing layer provided on the polysilicon-containing layer, and a side wall of the metal-containing layer being covered with the silicon-containing layer.

2. The device according to claim 1, wherein at least part of the silicon-containing layer is oxidized or nitrided.

3. The device according to claim 1, wherein in the silicon-containing layer, the silicon concentration is lower on a side of a surface of the silicon-containing layer than on a side of a junction between the part of the side wall and the silicon-containing layer.

4. The device according to claim 1, wherein the polysilicon-containing layer has:
   a first portion having a first width in a direction crossing the second direction and the first portion being in contact with the metal-containing layer; and a second portion having a second width wider than the first width and the second portion provided between the first portion and the second insulating film.

5. The device according to claim 4, wherein at least part of the silicon-containing layer is oxidized or nitrided.

6. The device according to claim 4, wherein in the silicon-containing layer, the silicon concentration is lower on a side of a surface of the silicon-containing layer than on a side of a junction between the part of the side wall and the silicon-containing layer.

7. The device according to claim 1, wherein the metal-containing layer includes tungsten.

8. The device according to claim 7, wherein at least part of the silicon-containing layer is oxidized or nitrided.

9. The device according to claim 7, wherein in the silicon-containing layer, the silicon concentration is lower on a side of a surface of the silicon-containing layer than on a side of a junction between the part of the side wall and the silicon-containing layer.

* * * * *